United States Patent [19]

Abe et al.

[11] Patent Number: 4,516,173
[45] Date of Patent: May 7, 1985

[54] IMAGE DATA CONVERSION METHOD AND CHARACTER CODE/CHARACTER PATTERN CONVERSION APPARATUS

[75] Inventors: Susumu Abe, Kawasaki; Akio Munakata; Takeshi Kitahara, both of Tokyo, all of Japan

[73] Assignee: Fujitsu Limited, Kawasaki, Japan

[21] Appl. No.: 353,334

[22] Filed: Mar. 1, 1982

[30] Foreign Application Priority Data

Mar. 6, 1981 [JP] Japan .................................. 56-32126
Mar. 11, 1981 [JP] Japan .................................. 56-35034

[51] Int. Cl.³ ............................................. H04N 7/12
[52] U.S. Cl. .................................... 358/261; 340/731
[58] Field of Search ......................... 358/261; 340/731

[56] References Cited

U.S. PATENT DOCUMENTS

| 4,107,662 | 8/1978 | Endo et al. | 340/731 |
| 4,107,786 | 8/1978 | Masaki et al. | 340/731 |
| 4,135,214 | 1/1979 | Weber | 358/261 |
| 4,212,036 | 7/1980 | Nakagome et al. | 358/261 |

Primary Examiner—Joseph A. Orsino, Jr.
Attorney, Agent, or Firm—Staas & Halsey

[57] ABSTRACT

An image data conversion method for converting the image data signal to the runlength signal through the process for reading once or several times a runlength code from a runlength conversion table for a given image data signal and a process for adding the pertinent runlength code when the same type of runlength code appears continuously. A character code/character pattern conversion apparatus which uses said image data conversion method, and provides, moreover, a multiplication device for multiplying character enlarging coefficient and the runlength code and a character interval inserting means which adds a character interval width code to the enlarged runlength code and outputs the input character code after converting it to the enlarged character pattern along with the interval code.

23 Claims, 15 Drawing Figures

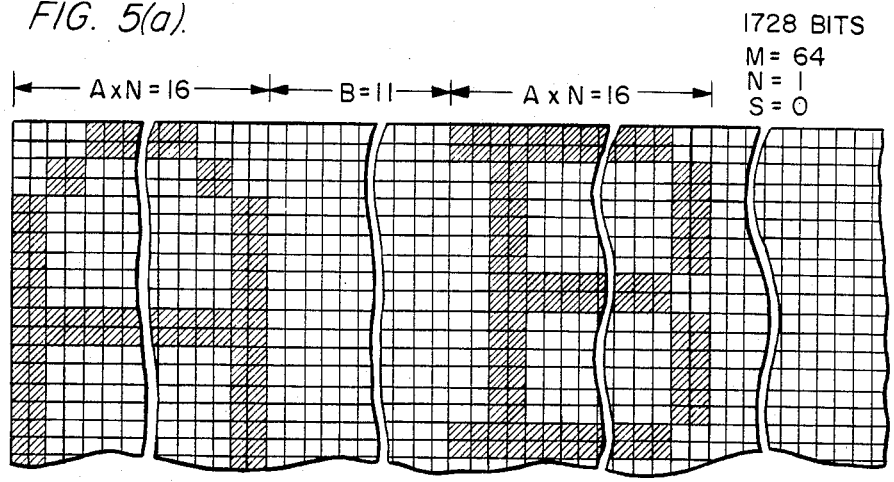
FIG. 5(a).  1728 BITS
M = 64
N = 1
S = 0
A x N = 16 — B = 11 — A x N = 16
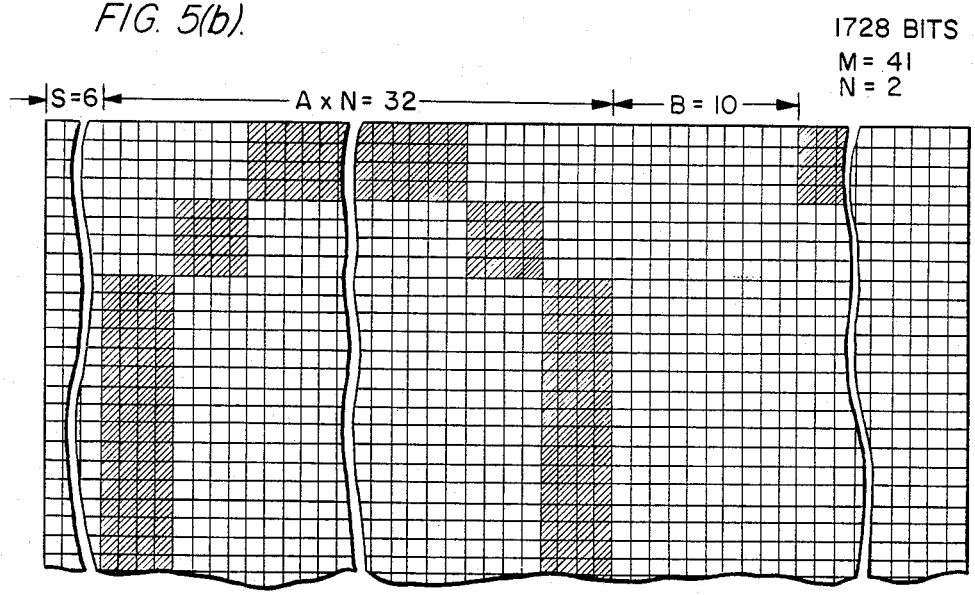
FIG. 5(b).  1728 BITS
M = 41
N = 2
S = 6 — A x N = 32 — B = 10

DECISION OF BLACK/WHITE

IMAGE DATA CONVERSION METHOD AND CHARACTER CODE/CHARACTER PATTERN CONVERSION APPARATUS

BACKGROUND OF THE INVENTION

1. Field of the Invention

This invention relates to an image data conversion method which is capable of primarily compressing at a high speed the image bit trains and to a character code/-character pattern conversion apparatus which converts character codes to character patterns utilizing said image data conversion method.

2. Description of the Prior Art

In image processing apparatus, for example, facsimile equipment, the number of picture elements of a line of the draft paper of size A4 (corresponding to one scanning line of a CRT, not a line of a sentence) is determined as 1728 bits or 2432 bits for the size A3. In the case of facsimile equipment, the amount of data to be transmitted is reduced since a photo-electric image conversion output is not transmitted directly but in general a band compression is carried out. Also, in the case of transmitting code output from computer to the facsimile equipment, band compression is required in the same way in place of the character pattern itself. If an access is made to a character generator (CG) with the code signal transmitted from the computer and the character pattern signal such as 5×7 or 16×16 dots/character is output and is subjected to the band compression for transmission to the facsimile equipment and characters are all fixed to a small constant size since the dot interval is small and constant as explained above. However, in some cases it is actually desirable to recognize that the title needs to be written in large size characters to be read easily and that the comments are written unattractively by small size characters. Therefore, it is desired to carry out character expansion and reduction processing for the output of CG.

In the case of ordinary facsimile equipment, the bit information for the image data of the pictures is converted to an intermediate code, for example, into a run length code in order to compress the bit information to be transmitted. This run length code indicates the same code bit a plurality of times and includes information indicating its length. For example, the bit train "001111000" is converted in such a way that 0 has a 2-bit length, 1 has a 4-bit length and 0 has a 3-bit length.

In the existing conversion system for converting image data into the runlength code, the image bit information is converted in to serial bits by a parallel to serial convertor and the number of bits appearing during the period between a first changing point (changing from 0 to 1 or from 1 to 0) and the next changing point is measured by means of a counter. This method results in a disadvantage in that the conversion processing requires a longer time because the serial bits must be checked or counted bit by bit and when the time required for the parallel to serial converter to output one bit is considered as t, the time n x t is necessary for converting the bit information of the image bit of n-bit into the bit length information.

Therefore, in order to improve such conversion time, it is possible, for example, to employ a system where a code conversion table is prepared and the input image data is converted to the runlength code only with an access to the table. According to this conversion table, a problem arises, where the conversion time can be improved considerably because it is determined only by the retrieval time of conversion table because the table size becomes large where the image data length in units of data to be converted such as the facsimile data is comparatively long.

For this reason, a conversion system is proposed herein which respectively solves the disadvantages of the existing bit serial conversion system by means of the conversion table.

SUMMARY OF THE INVENTION

An object of this invention is to execute at a high speed a runlength code conversion with less hardware than conventional converters and facilitate character expansion and character interval setting as desired for the character data pattern to be transmitted.

In order to attain such an object, an image data conversion method of the present invention holds in the runlength conversion table at least the runlength code in one or plural storage areas which corresponds to the image data signal, calculates by using calculating means which is controlled for calculation by the output of said runlength conversion table and provides a calculation output which is used as a part for the access address of said runlength conversion table, and holding in a register means temporarily the runlength code ouput from said runlength conversion table. The method also includes detection with the detection means which detects the change of white/black codes output from said runlength conversion table and addition with addition means which adds the content of said register means and the output of said runlength conversion table under the control of said detection means when the same type of codes appear continuously and outputs the result to said register means. The method further includes converting the image data signal to the runlength code signal by a process of reading once or plural times the runlength code from said runlength conversion table for the given image data signal and the process of adding the pertinent runlength codes when the same type of runlength codes appear continuously.

Moreover, in order to attain such object, the character code/character pattern conversion apparatus of the present invention includes means for generating a character a pattern signal
corresponding to the character code from said character code signal input, means for converting said character pattern signal into the runlength code in units of line, means for multiplying a character expansion coefficient with the runlength code output from said converting means, and character interval insertion means which adds a character interval width to the enlarged runlength code output from said multiplication means, and outputs the input character code after converting it into an enlarged character pattern.

BRIEF DESCRIPTION OF THE DRAWINGS

FIG. 3 is an input-output relation diagram of the conversion table of an embodiment of FIG. 1.

FIG. 5, including 5(a) and 5(b), explains character enlarging procedures.

DESCRIPTION OF THE PREFERRED EMBODIMENT

Figure 1:
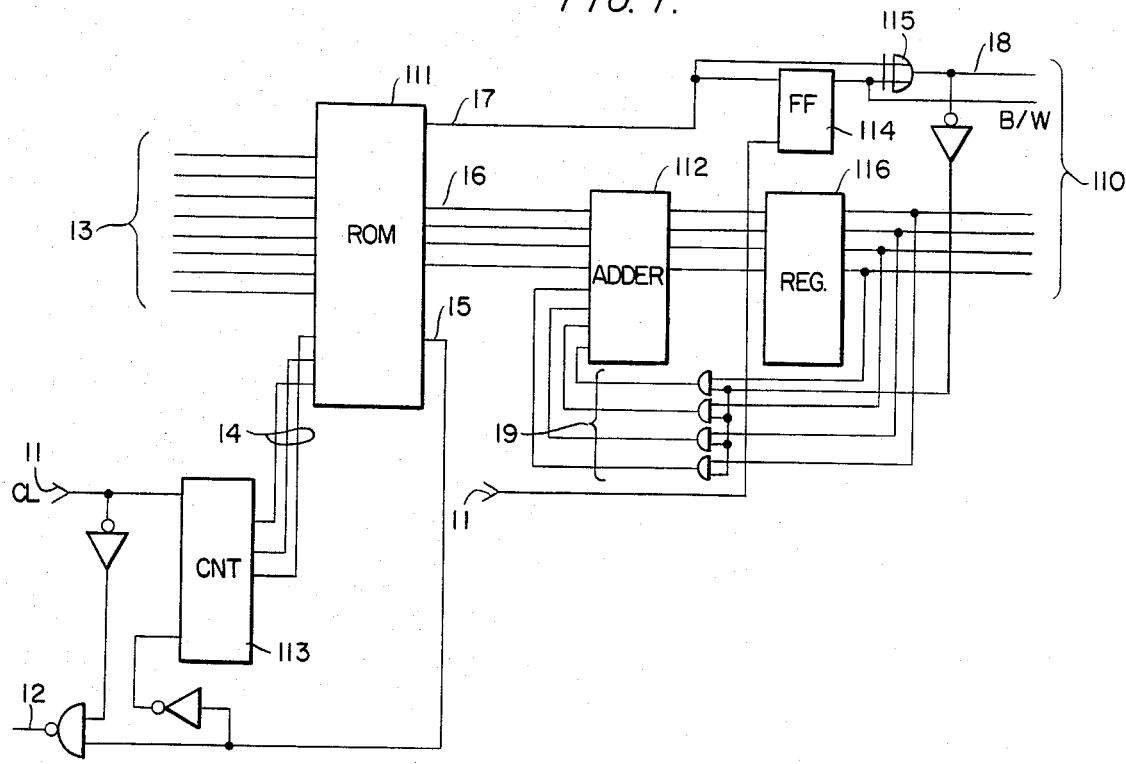
FIG. 1 is a runlength code conversion circuit of an embodiment of the present invention.

The preferred embodiment of the present invention will be explained, with reference to the drawing. In FIG. 1, 11 is a conversion clock signal line; 12 is a bit train update signal line; 13 is a input bit signal line to be converted; 14 is a conversion cycle signal line; 15 is a conversion end flag signal line; 16 is a partial bit length signal line; 17 is a code output signal line indicating 1 and 0 of bit train; 18 is a code output change detecting signal line; 19 is an added value signal line; 110 is a conversion result output line; 111 is a conversion table or read only memory (ROM); 112 is the adder; 113 is an counter; 114 is a D type flip-flop; 115 is an exclusive OR gate; and 116 is a register.

Figure 2:
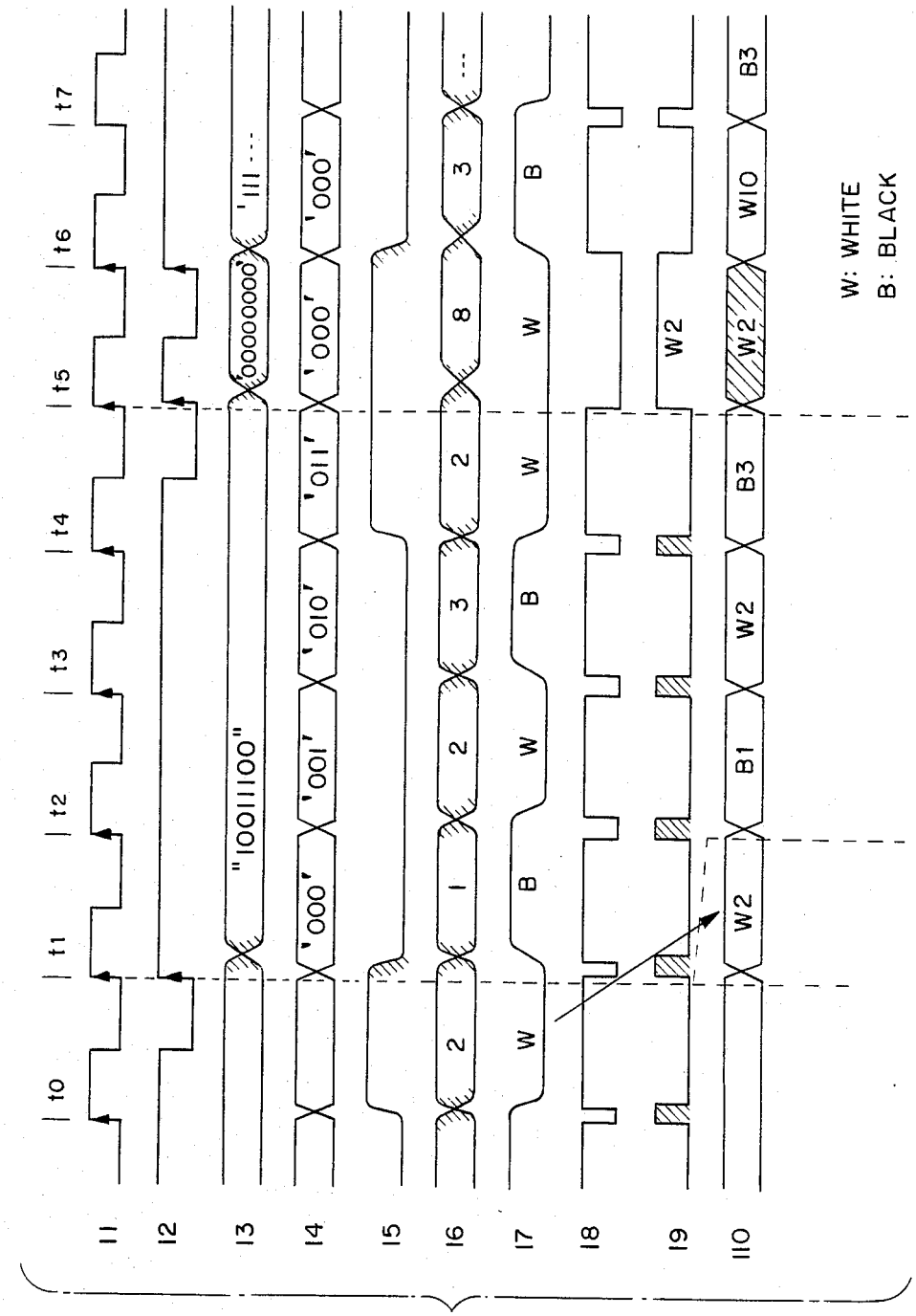
FIG. 2 is a time chart for explaining the circuit-operation of FIG. 1.

In FIG. 2 and FIG. 3, the portions with the same numbering, as in FIG. 1, indicate the signal waveform and logical condition on the corresponding signal lines of FIG. 1.

The following bit train is considered for conversion:

... 100△10011100△00000000△1110

A triangle △ indicates the location of a partitioning of the bit train into a partial train (split bit train). In this example, the input data is split every 8-bits for conversion.

The clock on the conversion clock signal line 11 is input into the counter 113, generating the conversion cycle signal on the conversion cycle signal (counter value) line 14. The input data on the input bit signal line 13, along with the conversion cycle signal data, is applied to the conversion table 111 inputs and a conversion output is read from the conversion table 111. The signal on the line 15 is the conversion end flag signal, the signal on the line 16 is the partial bit length signal indicating one same code length for the divided input data, the signal on the line 17 is the code output signal indicating "1" or "0" (black or white in the image data) of the same code. The signal on the bit train update signal line 12 is used to control updating the bit train on the input bit signal line 13 with the next split bit train to be converted next by detecting the conversion end flag signal. The signal on the code output change detecting signal line 18 is used for detecting a change of signal type on the code output signal line 17 and is an output of the code output change detecting means which comprises the type D flip-flop 114, which receives the data input from the code output signal line 17 and the clock input from the conversion clock signal line 11, and the exclusive OR gate 115.

Namely, when the code output before one conversion clock and the code output in the next conversion clock match, an output becomes "0" as shown in $t_5$ of FIG. 3.

When the code change detecting signal is "0", the content of the partial bit length output signal before one conversion clock stored in the register 116 is input as the adder value signal to the adder 112 and it is added to the partial bit length output signal in the next conversion clock. Thereby the partial bit length output can be obtained.

Namley, addition control by the signal on the code output change detecting signal line 18 is carried out for adding the partial bit length output signal 16 of the conversion output and executing the operation for obtaining a larger value in case no code change occurs between the split bit trains (namely, the same white or black continues).

Each circuit of FIG. 1 changes its status at the rising portion of the clock signal on the conversion clock signal line 11. The signal on the bit train update signal line 12 is generated so that it can update the bit train at its rising portion. In actual practice, since the memory address of the conversion table or ROM 111 is updated by the signal on the bit train update signal line 12 and an output of the memory is considered as the input bit signal to be converted, a memory access time is required until said input bit signal to be converted is stabilized from the rising of the memory output. Because of the address input of conversion table (ROM) 111, the conversion end flag signal (line 15), partial bit length signal (line 16) and the code output signal (line 17), which indicates 1 or 0 of bit train are output require a considerable time to stabilize from the rise of clock signal on this conversion table 111 because this conversion table 111 provides a delay time since it is a memory. As a result, the code output change detection signal (line 18) and the added value signal (line 19) changes into a meaningless fashion during this period and it is considered as invalid during this period (Refer to the hatched area of FIG. 2). The operation of the circuit now will be explained with reference to FIG. 1 and FIG. 2. The converstion table output (lines 15, 16, 17) of the time $t_1$ for the inputs (input bit signal, conversion cycle signal) becomes black 1 (the code output signal line 17 indicates black by 1, while the partial bit length signal line 16 indicates one bit length by 1) and then the length code is input to the adder 112. The signal on the added value signal line 19 is not input to the adder 112 if the code output signal line 17 is changed with respect to the code output before one conversion clock. Therefore, the information of black 1 is stored into the register 116 at the rising portion of the conversion clock (line 11) at the beginning of the timing $t_2$ and then output on the conversion result output line 110. In addition, when the conversion clock rises at the beginning of $t_2$, the conversion end flag (line 15) indicates continuation of conversion by 0. As a result, the counter 113 counts up and outputs the conversion cycle signal (line 14) indicating that the conversion cycle is updated.

Figure 4:
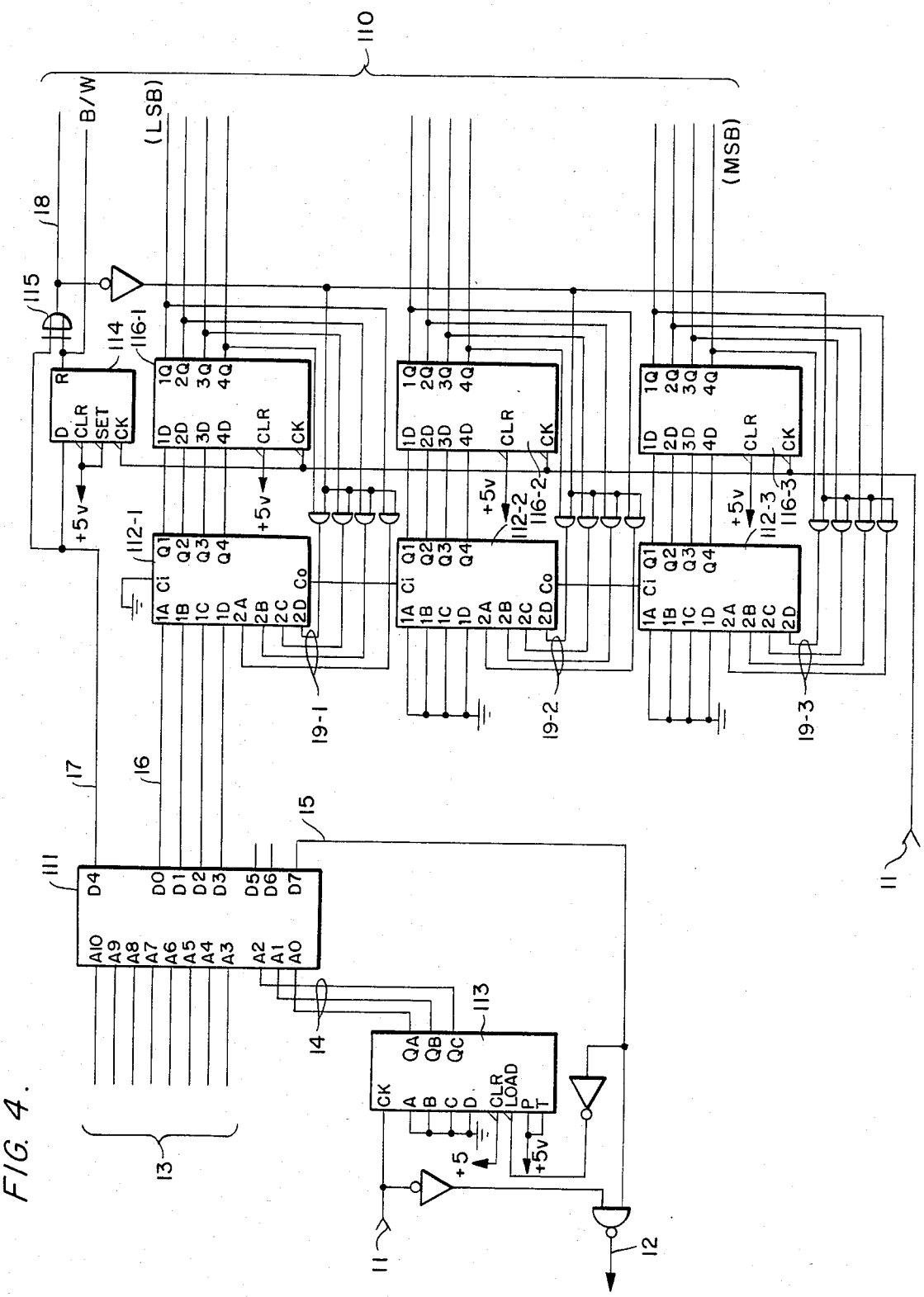
FIG. 4 shows in detail the circuit of FIG. 1.

In the same way, the cycle continues up to $t_4$, the conversion end flag (line 15) indicates the end of conversion by 1. Therefore, the counter 113 is initialized (ALLO) and the bit update pulse for the bit train update signal is transmitted. The added value (line 19) at the time $t_5$ and the code output signal 110 (white) at the time of $t_5$ match. The white 2 which is the result at the time of $t_4$ is input to the adder 112 and is added to the table output at time $t_5$. The result is output to the conversion result output line 110 at the time $t_6$. In the detailed view of FIG. 4, those elements which are the same in FIG. 1 and FIG. 4 are given the same numbering. The numbering 112-1 to 112-3 in FIG. 4 corresponds to the adder 112 in FIG. 1 and the numbering 116-1 to 116-3 in FIG.

4 corresponds to the register 116 in FIG. 1, and the numbering 19-1 to 19-3 in FIG. 4 corresponds to the added value signal line 19 in FIG. 1.

According to the image data conversion method explained in FIG. 1 to FIG. 4, the clock cycle which is the same as that in the existing system is required for the conversion of pattern where 1 and 0 of the bit information appears alternately, but a large effect can be obtained with the present invention, where conversion can be realized at a high speed with the very least number of clocks (about a half of the existing method in the case of this example) as compared with the existing method, in a case 1 or 0 appears continuously for several numbers in the input information.

In this system, the input bit train is converted by the conversion table after it is divided and as a result a large conversion table is no longer required. This is a notable advantage of this method.

A character code/character pattern conversion apparatus will now explained. When enlarging characters, the number of picture elements of a line of a facsimile picture is fixed to 1728 bits (size A4) or 2432 bits (size A3) and characters and character intervals must be given in this bit length without any vacant area. Therefore, when a unit bit of one character is considered as A, an enlargement coefficient of character as N, a number of characters of a line as M and a character interval as B, each parameter must be determined so that the respective following equation is satisfied.

Size A4: $1728 = (A \times N + B) \times M$, $A \times N \geq B$
Size A3: $2432 = (A \times N + B) \times M$, $A \times N \geq B$ (Where, A, N, B, M are integers)

Here, a line starts with a character and the last character is followed by the character interval B. Values of parameters when the unit bit of one character is determined as 16 are shown in Table 1.

TABLE 1

| Size A4 | | | Size A3 | | |
|---|---|---|---|---|---|
| M | N | B | M | N | B |
| 108 | 1 | 0 | 152 | 1 | 0 |
| 96 | 1 | 2 | 128 | 1 | 3 |
| 72 | 1 | 8 | 76 | 1 | 16 |
| 64 | 1 | 11 | | 2 | 0 |
| 54 | 1 | 16 | 64 | 2 | 6 |
| | 2 | 0 | 38 | 2 | 32 |
| 48 | 2 | 4 | | 3 | 16 |
| 36 | 2 | 16 | | 4 | 0 |
| | 3 | 0 | 32 | 3 | 28 |
| | | | | 4 | 12 |
| . | . | . | . | . | . |
| . | . | . | . | . | . |
| . | . | . | . | . | . |

As shown in Table 1, a problem arises here that the number of characters to a line, the size of character and the character interval are fixed in relation to the divisor of the number of picture elements of a line, and the desired size of character and desired character interval cannot be accomplished because an uneven enlarged fit occurs. This invention has solved this problem by the method explained later and makes it possible to set in units of line any desired size of character and any desired character interval.

As shown in FIG. 5(a), when the unit bit of one character $A = 16$, the character interval $B = 11$, the character enlarging coefficient $N = 1$, the relations $1728 = (A \times N + B) \times M$, $A \times N \geq B$ (A, N, B, M are integers) can be obtained. But, as shown in FIG. 5(b), when enlarged as $A = 16$, $N = 2$, $B = 10$, the remainder $S = 6$ can be obtained. This remainder S satisfies or completes the number necessary for bits of a line and makes it possible to set any desired character size and any character interval with a satisfactory condition when the remainder is placed between the line starting edge and the first character.

Figure 6:
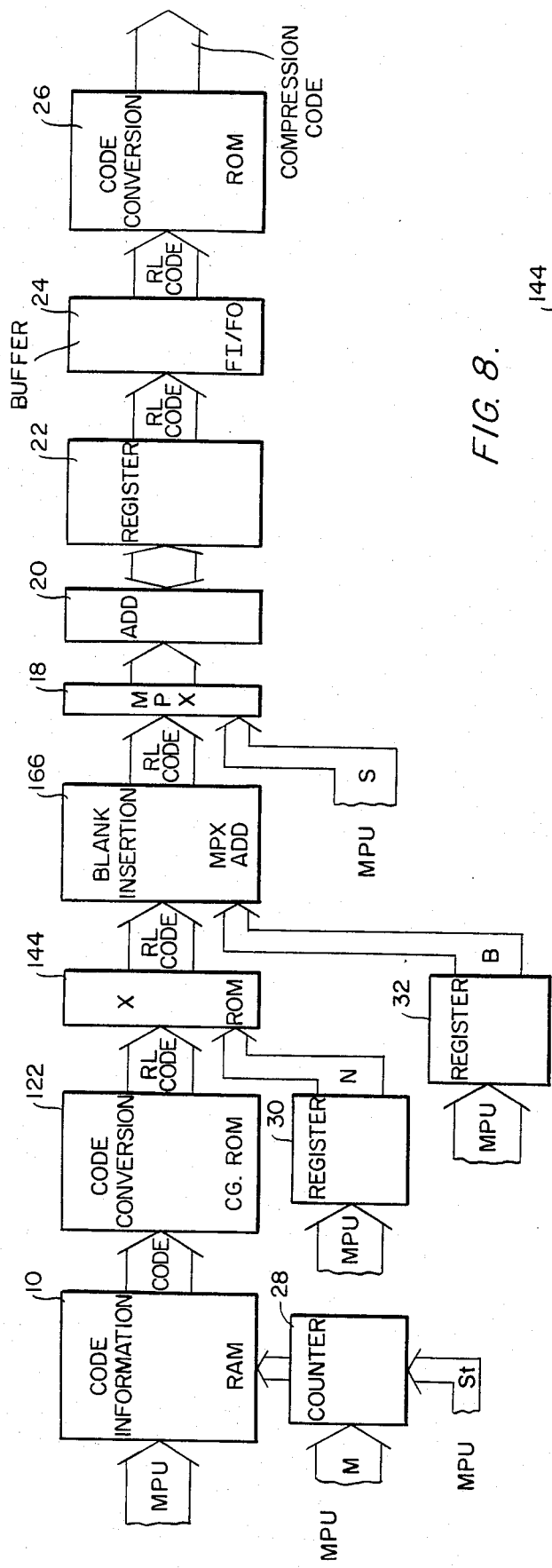
FIG. 6 is a circuit block diagram of a character code/character pattern conversion apparatus of an embodiment of the present invention.

FIG. 6 shows the circuit block for said control which is connected to an MPU (microprocessor unit). 10 is a circuit or code memory for storing code information. In this embodiment, this circuit comprises a RAM (random access memory) and allows the desired character code to be written from the MPU. 28 is a code memory control counter and changes the mode of write and read of said memory 10 and controls the number of characters. For example, when the number of characters $M = 41$ is obtained by the MPU's operation in accordance with the respective equation, said MPU loads the number of characters 41 into the counter 28 and moreover writes the character code required, 41 as a maximum, into the memory 10. When the start signal St is input from the MPU under this condition, the counter 28 executes the processing, for example, sequentially reads said 41 codes from the memory 10. 30, 32 are registers, into which the character enlarging coefficient N and character interval B are respectively loaded by the MPU.

122 is the code converter including the CG and ROM (read only memory), which converts the input character code signal to the image (character pattern) and further converts such image signal to the run-length code.

Figure 7A:
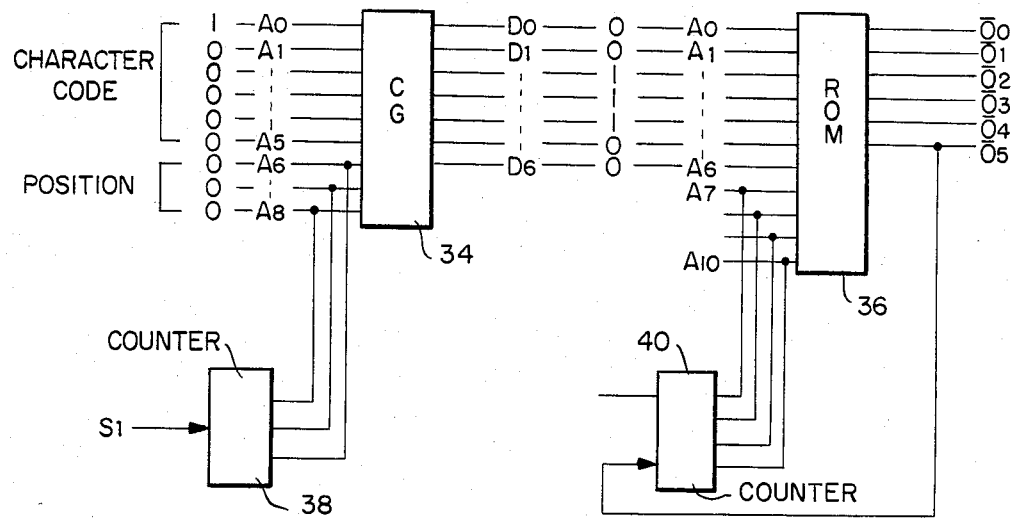
FIG. 7, including 7(a)–7(d), to FIG. 9 are block diagrams indicating detailed portions of FIG. 6 and tables explain the block diagram.
Figure 7B:
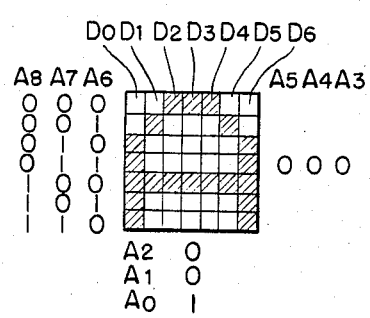

A detailed explanation will be given below, with reference to FIG. 7. 34, 36 are the CG and ROM mentioned above and 38, 40 are counters for outputting a part of the address signals necessary for making access. When the character code bits $A_0$ to $A_5$ being input from the code memory 10 are code "100000" indicating the character "A", said code is input to CG 34 as a part of the address signal and the 3-bit output of the counter 38 is input to the CG 34 as a remainder of said address signal. The former address signal indicates the characters and the latter address signal indicates the line including said character image and outputs the pattern signals (image data) $D_0, D_1, \ldots, D_6$ of the pertinent line. The image data $D_0$ to $D_6$ are 0011100 for the first line ($A_6, A_7, A_8 = 0$) as shown in FIG. 7(b) in the case of character A, 0100010 for the second line ($A_6 = 1, A_7, A_8 = 0$) and ... for the third line ($A_6 = A_8 = 0, A_7 = 1$) etc. After an output of one line is obtained, the clock $S_1$ is input to the counter 38 and thereby said counter makes an increment of +1 to the counter value and outputs the image data corresponding to the next line. In this example, each 3-bits in the former half and the latter half of the character codes $A_0$ to $A_5$ designates the row and column of the character pattern groups arranged in the form of a matrix. Herein, the character pattern is indicated by $7 \times 7$ dots and a number of characters as little as $8 \times 8 = 64$ are used. But actually in practice the character pattern is expressed by $16 \times 16$ dots as explained above and a considerable number of characters are actually used.

The image data $D_0$ to $D_6$ sent from CG becomes the address signal of ROM 36 in combination with the 4-bit output of the counter 40 and the ROM 36, which is to be accessed by said signal, sequentially outputs the run-length codes $\overline{O}_0$ to $\overline{O}_5$. For example, in case the image data $D_0$ to $D_6$ is 0011100, white 2, black 3, white 2, white 0 are sequentially output. The last white 0 indicates the character interval and this is attached to the output of all CG's. The counter 40 is reset at the timing of the output of said white 0 and gets ready for runlength code conversion of the next image data. $S_2$ is the clock for making an increment of +1 to the counter 40.

Figure 7C:
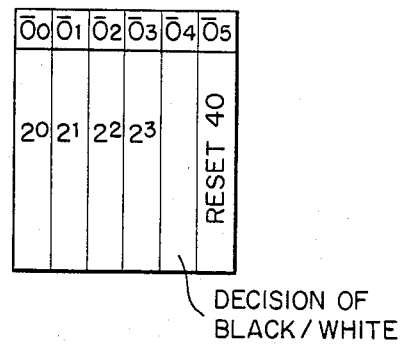
Figure 7D:
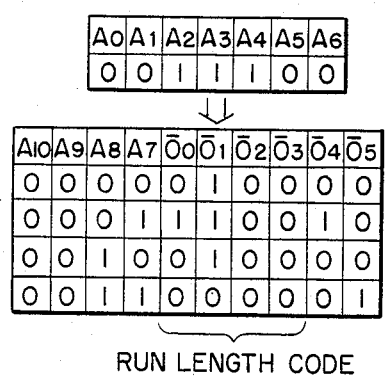

This will be further explained with reference to FIG. 7(c). As indicated in the figure, $\overline{O}_0, \overline{O}_1, \overline{O}_2, \overline{O}_3$ of image data indicate the number of whites and blacks, respectively the numbers as $2^0, 2^1, 2^2, 2^3$. $\overline{O}_4$ indicates white or black and it indicates black when it is 1 or white when it is 0. $\overline{O}_5$ is used for resetting the counter 40 and reading the next character code. When it is 1, this image data resets the counter 40 and reads the next character code. As in the case of above shown in FIG. 7(d), when $A_0$ to $A_6$ is S0011100, the address signals $A_0$ to $A_{10}$ of the ROM 36 become as follows in the initial condition where the count value of counter 40 is 0. $A_0$ to $A_6$ is 0011100, $A_7$ to $A_{10}$ is 0000 and the ROM output is 010000 as shown in FIG. 7(d) at $\overline{O}_0$-$\overline{O}_5$. (Data is written as indicated above.) It is apparent from FIG. 7(c) that this indicates white 2. When it is output, the counter makes an increment of +1 and the output $A_7$ to $A_{10}$ becomes 1000. The output $A_0$ to $A_6$ does not change. When accessed by such addresses $A_0$ to $A_{10}$, the ROM 36 outputs $\overline{O}_0$ to $\overline{O}_5$=110010 and as shown in the FIG. 7(c) indicates black 3. The similar operations are also carried out successively. Finally, $\overline{O}_5$ becomes 1 and the counter 40 is cleared to 0000 and then next character code is read.

Figure 8:
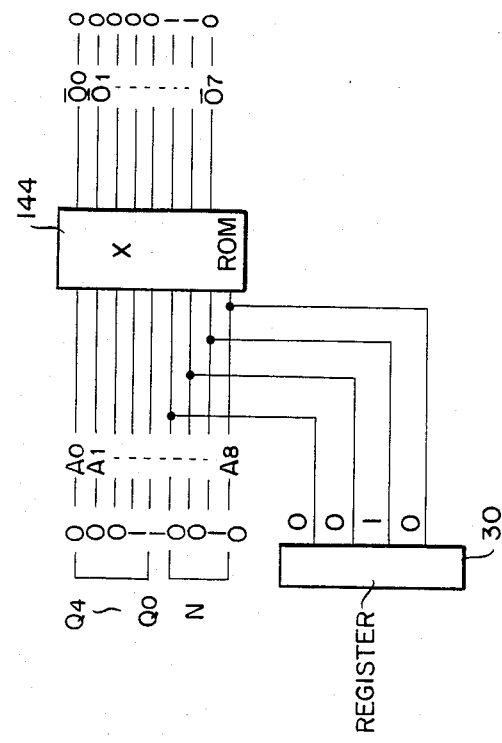

In FIG. 6, 144 is the multiplier comprisinsg a ROM. This multiplier outputs the runlength×N (data is being written in such a manner) with the address of the runlength (RL) code of the output of coder converter 112 and the output N (character enlarging coefficient) of the register 30. In the above example, since runlength is 01000, 11001, 01000, when it is doubled (N=2), 00100, 01101, 00100 is obtained and these runlength codes are sequentially output. Such runlength can be multiplied by N easily. The character interval B is set as white 0, namely as 00000. Thereby, it is 0 when it is multiplied by N, making easy the operation for character enlargement. FIG. 8 shows, as an example, the outputs $\overline{O}_0$ to $\overline{O}_7$ of the multiplier 144 when N=2, white 3.

Figure 9:
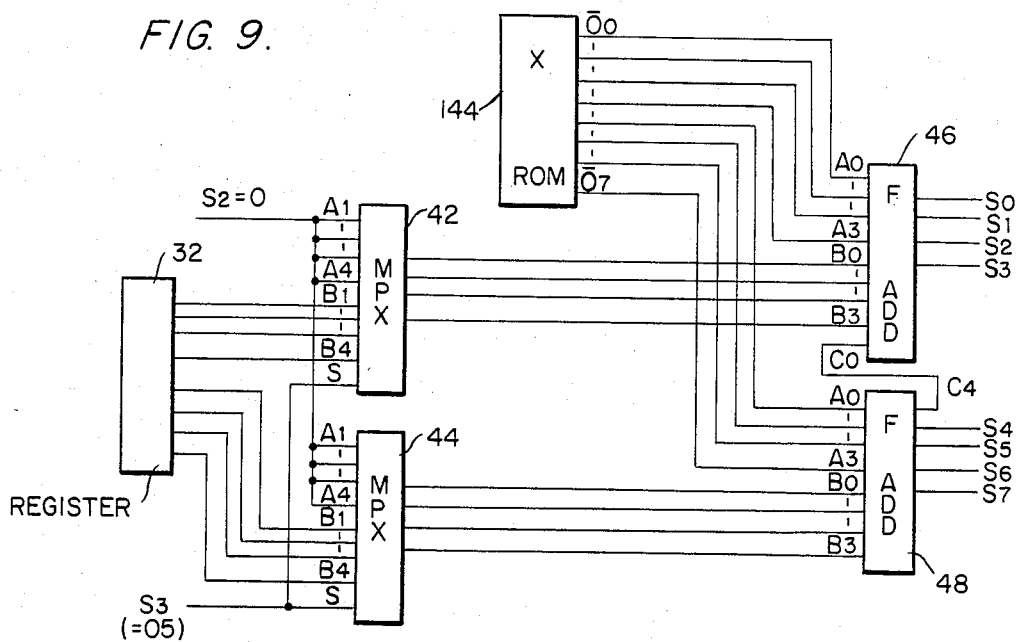

In FIG. 6, 166 is the character interval insertion circuit and includes an adder ADD and multiplexer MPX. This circuit has the structure shown in FIG. 9. 42, 44 are said multiplexer, while 46 and 48 are total adders. In a case of a runlength code other than the white 0 runlength code 00000 which indicates the character interval, the signal $S_3$ is 0 and when the multiplexers 42, 44 select the signal $S_2$ which is always 0 and outputs 0 when it receives such runlength code, ignoring the content of character interval register 32. The signal $S_2$ becomes 1 with the character interval white 0 runlength code and at this time the multiplexers 42, 44 select the register 32 and output the content of said register, namely the character interval B to the total adders 46, 48. Therefore, the adders 46, 48 add the output of multiplier 144 (white 0 in this case) and the output B of the multiplexer and then outputs the results $S_0$ to $S_7$. Thus, the interval B is inserted between characters.

In FIG. 6, 18, 20 and 22 function as a runlength code adder. The MPX 18 selects the initial value S sent from the MPU and this is set to the register 22. Thereafter, MPX 18 selects the character interval insertion circuit 16 and causes the adder 20 to add the white or black runlength codes. For example, if the initial values S indicates the white interval, when the first output of the circuit 16 after taking S is white x1, the adder 20 is caused to execute S+x1. In case a character appears successively, the runlength code becomes black x2 and the addition of white runlengths terminates. But in case many white codes continue such as the white in the latter part of the preceding character like the character interval, white of character interval and white at the former part of the next character, and all white runlengths are added. In case any change appears, for example, a black code appears next, addition is suspended and the result obtained is loaded into the buffer 24.

The runlength addition by this adder 20 and register 22 is similar to the runlength addition in FIG. 1 explained above.

The buffer 24 is a first-in, first-out type register and it is intended to absorb the runlength calculation time which changes depending on the image pattern. 26 is a circuit which converts the runlength code to the one-dimensional coding code. In this embodiment, this circuit comprises a ROM and previously stores the data and number of bits of primarily compressed code corresponding to the runlength code, and then outputs the corresponding primarily compressed code. Examples of the code conversion carried out by the conversion circuit 26 are shown in Table 2 and Table 3.

TABLE 2

| | (Terminating code) | | |
|---|---|---|---|
| White runlength | Code | Black runlength | Code |
| 0 | 00110101 | 0 | 0000110111 |
| 1 | 000111 | 1 | 010 |
| 2 | 0111 | 2 | 11 |
| 3 | 1000 | 3 | 10 |
| 4 | 1011 | 4 | 011 |
| . | . | . | . |
| . | . | . | . |
| . | . | . | . |
| . | . | . | . |
| . | . | . | . |
| 62 | 00110011 | 62 | 000001100110 |
| 63 | 00110100 | 63 | 000001100111 |

TABLE 3

| | (Make up code) | | |
|---|---|---|---|
| White runlength | Code | Black runlength | Code |
| 64 | 11011 | 64 | 0000001111 |
| 128 | 10010 | 128 | 000011001000 |
| 196 | 010111 | 192 | 000011001001 |
| 256 | 0110111 | 256 | 000001011011 |
| . | | . | |
| . | | . | |
| . | | . | |
| . | | . | |

As the runlength code sent from the buffer 24, the white and black runlength appear alternately and these are converted to the codes indicated in Table 2 and Table 3 by the circuit 26. The runlength of 0 to 63 is coded only by the terminating code. For runlenth 64 and higher, the make-up codes expressing the runlength which indicates that it is equal to such run or shorter is used at first and thereafter the remaining runlengths indicated by the terminating code are placed. An output of the convertor circuit 26 is transmitted to the remoted facsimile receiver via the modem and transmission line.

Figure 10:
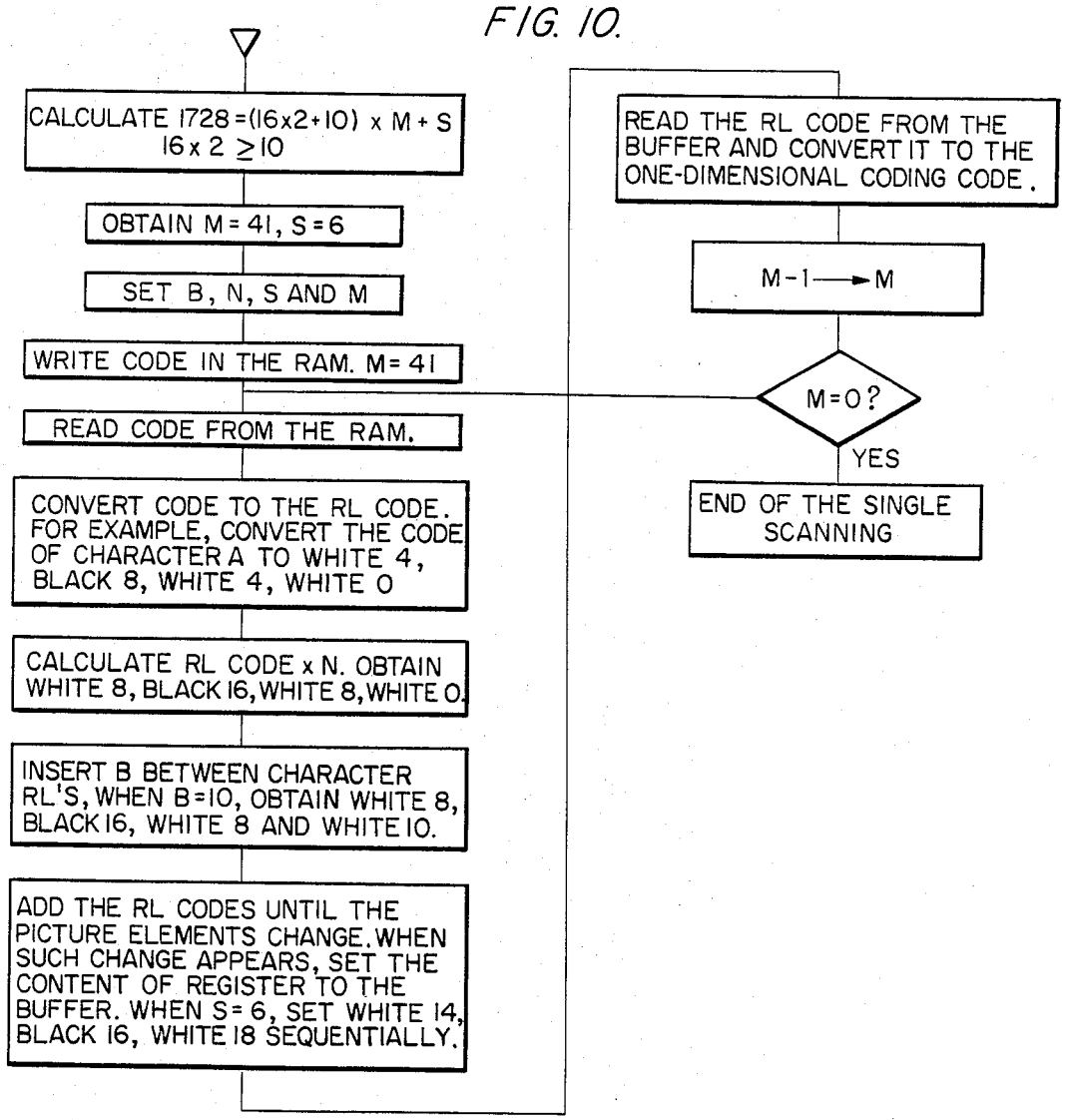
FIG. 10 is a flow chart indicating the enlarging operation procedures.

The operations of this apparatus already explained in previous sections are summarized as indicated in FIG. 10. In FIG. 10, A is 16, N is 2 and B is 10. In this example, the MPU calculates at first the equation $1728=(16\times2+10)\times M+S$, $16N\geq B$, and outputs $M=41$, $S=6$. These parameters B, N, S and M are set to the registers 32, 30, 22 and counter 28. successively, the processings indicated in the figure, such as entry of character code to RAM 10 are carried out.

It is apparent that the embodiment shown in FIG. 6 to FIG. 10 utilizes the embodiment shown in FIG. 1 to FIG. 4. Namely, the ROM 36 shown in FIG. 7 corresponds to the conversion table or ROM 111 shown in FIG. 1, while the counter 40 shown in FIG. 7 corresponds to the counter 113 shown in FIG. 1, the adder 20 shown in FIG. 6 corresponds to the adder 112 shown in FIG. 1 and the register 22 shown in FIG. 6 corresponds to the register 116 shown in FIG. 1, respectively.

The embodiments shown in FIG. 6 to FIG. 10 realize effectively and simultaneously the runlength conversion operation, character enlargement and character interval inserting operation by adding the multiplier 14, character interval inserting circuit 16 and multiplexer 18 between the conversion table 111 and adder 112 shown in FIG. 1.

Figure 11:
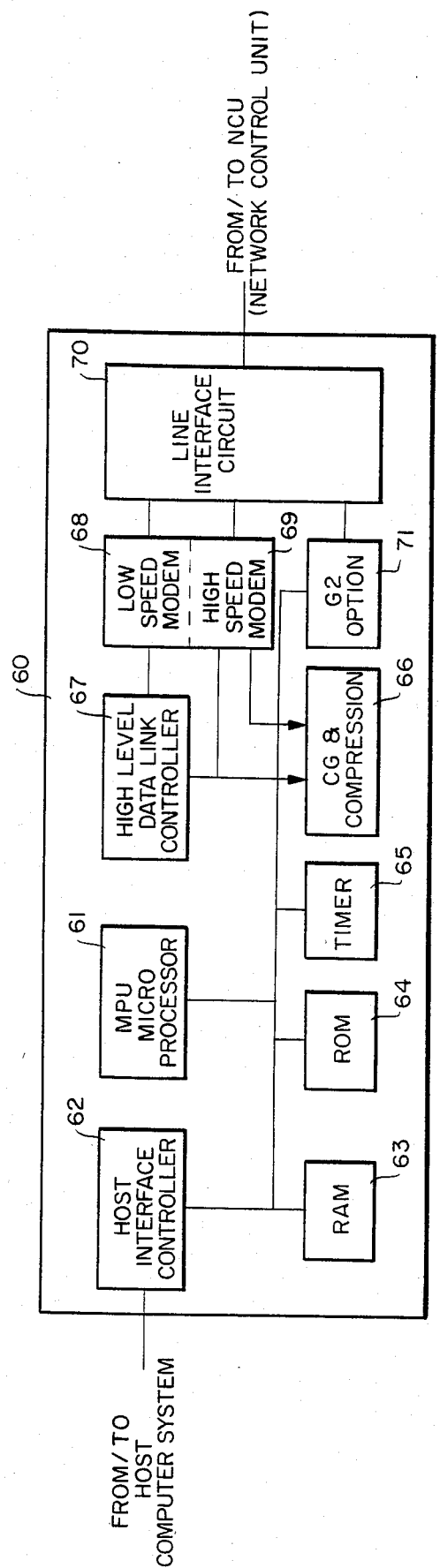
FIG. 11 is a block diagram of the facsimile communication equipment using the circuit of the embodiment of FIG. 6.

FIG. 11 shows the block diagram of facsimile communication equipment where the character code/character pattern conversion apparatus using the embodiment explained in FIG. 6 to FIG. 10 is included.

In FIG. 11, 60 is the facsimile communication equipment; 61 is the micro-processor unit; 62 is a host interface controller; 63 is a RAM; 64 is a ROM; 65 is a timer; 66 is the character code/character pattern compression converter; 67 is a high-level data link controller; 68 is the low speed modem; 69 is a high speed modem; 70 is a line interface and; 71 is a G2 option circuit.

In FIG. 11, the character code/character pattern compression converter 66 corresponds to the circuit shown in FIG. 6.

As explained above, the present invention realizes high speed conversion of an image pattern to runlength data and also realizes desired character enlargement and character interval insertion simultaneously with conversion to the runlength data. Particularly, the present invention provides such an excellent effect of alleviating the load on a computer when transmitting character image data to the facsimile terminal from the computer.

While the present invention has been described with respect to a specific embodiment thereof, it is to be understood that the present invention is not limited thereto in any way but covers any and all changes and modifications which are possible within the scope of the appended claims.

We claim:

1. An image data conversion method using a runlength conversion table, calculation means, register means, detecting means and adding means, said method comprising the steps of:

(a) converting the image data into a runlength code using the runlength conversion table where the runlength conversion table holds at least runlength codes in each of a plurality of storing areas corresponding to the image data, the runlength codes including black and white codes;

(b) calculating to output the contents of each of the plural storing areas, where the calculation means is controlled for performing calculations by the output of said runlength conversion table and produces a counting output used as a part of an access address of said runlength conversion table;

(c) storing the runlength code in the register means and temporarily holding the runlength code output from said runlength conversion table therein;

(d) detecting, using the detecting means the change between white and black codes output from said runlength conversion table; and (e) adding, using the adding means which outputs the runlength codes to said register means, the content of said register means and the output of said runlength conversion table in accordance with a control by said detecting means when the same kind of runlength codes appear continuously, and thereby converting the image data to the runlength codes through reading once or several times the runlength codes from said runlength conversion table for the given image data signal and adding the runlength codes when the same type of runlength codes appear continuously.

2. A character code/character pattern conversion apparatus, comprising:

means for receiving an input of a character code and generating a character pattern signal corresponding to said character code;

means, operatively connected to said means for receiving, for converting said character pattern signal into a runlength code;

means, operatively connected to said means for converting, for multiplying a character enlargement coefficient and the runlength code output by said conversion means and producing an enlarged runlength code; and character interval inserting means, operatively connected to said means for multiplying, for adding a character interval code to the enlarged runlength code output by said means for multiplying, and outputting the interval code and the runlength code after converting it to the enlarged runlength code.

3. A character code/character pattern conversion apparatus as claimed in claim 2, further comprising adding means, operatively connected to said character interval inserting means, for allowing an initial value to be preset in order to keep a total number of dots in a line to a constant value and for allowing the same kind initial runlength code having a runlength equal to the initial value to be added to the runlength codes sequentially input from said character interval inserting means.

4. A character code to image data conversion apparatus, comprising:

conversion means for converting a character code to a series of sequential image data units each indicating a type of image data and the runlength of the image data;

detection means, operatively connected to said conversion means, for detecting changes in the type of image data unit between two sequentially related image data units; and combining means, operatively connected to said conversion means and said detection means, for combining the runlengths of types of the sequentially related same type data units into a single image data unit in dependence upon the detection of the same type image data unit by said detecting means, so that said single image data unit, including the combination of sequentially related data units of the same type, is produced having the type of and the runlength equal to the sum of the runlengths of the sequentially related same type data units.

5. An apparatus as claimed in claim 4, wherein said conversion means comprises:
   a read only memory operatively connected to receive the character code and to said detection means and said combining means; and
   a counter, operatively connected to said read only memory, for providing part of an address for said read only memory in dependence on an output of said read only memory.

6. An apparatus as claimed in claim 4, wherein said detection means comprises:
   a flip-flop operatively connected to said read only memory; and
   a logic gate operatively connected to said conversion means, said flip-flop and said combining means.

7. An apparatus as claimed in claim 4, wherein said combining means comprises:
   addition means, operatively connected to said conversion means, for adding and providing an output;
   storage means, operatively connected to said addition means, for storing the output of said addition means; and
   gate means, operatively connected to said detection means, said storage means and said addition means, for transferring the contents of said storage means to said addition means in dependence upon the detection of sequential data units of the same type, said addition means adding the runlength stored in said storage means to the runlength output by said conversion means when sequential data units of the same type are detected.

8. A character code conversion and enlargement apparatus for character codes produced by an external character code generator producing character codes, a character code count and a size change code, said apparatus comprising:
   character code storage means for storing the character codes;
   count means, operatively connected to said character code storage means and the external character code generator, for sequentially reading out the character codes from said character code storage means using the character code count;
   code conversion means, operatively connected to said character code storage means, for converting each of the character codes into a group of image data units, each including type and runlength; and
   multiplying means, operatively connected to said code conversion means and the external character code generator, for multiplying the runlength times the size change code to form a new image data unit.

9. An apparatus as recited in claim 8, wherein the external character code generator produces a blank interval code, and said apparatus further comprises blank insertion means, operatively connected to said multiplying means and the external character code generator, for inserting a blank image data unit between each group in dependence upon the blank interval code.

10. An apparatus as recited in claim 8, wherein the external character code generator produces a starting code, and said apparatus further comprises multiplex means, operatively connected to said multiplying means and the external character code generator, for inserting a start image data unit at the front of the first group in dependence upon the starting code.

11. An apparatus as recited in claim 8, further comprising combining means, operatively connected to said multiplying means, for combining sequential image data units having the same type.

12. An apparatus as recited in claim 8, further comprising means, operatively connected to said multiplying means, for converting the image data units into compressed codes.

13. An apparatus as claimed in claim 8, wherein said code conversion means comprises:
   conversion means, operatively connected to said character code storage means, for converting each character code to the group of sequential image data units;
   detection means, operatively connected to said conversion means, for detecting changes in the type of image data unit between two sequentially related image data units; and
   combining means, operatively connected to said conversion means and said detecting means, for combining, the runlengths and types of the sequentially related same type data units into a single image data unit in dependence upon the detection of the same type sequentially related image data units by said detecting means, so that said single image data unit, including the combination of sequentially related data units of the same type, is produced having the type of and a runlength equal to the sum of the runlengths of the sequentially related same type data units.

14. An apparatus as recited in claim 13, wherein said conversion means comprises:
   a read only memory operatively connected to said character code storage means, said detection means and said combining means; and
   a counter, operatively connected to said read only memory, for providing part of an address for said read only memory in dependence on an output of said read only memory.

15. An apparatus as claimed in claim 13, wherein said detection means comprises:
   a flip-flop operatively connected to said conversion means; and
   a logic gate operatively connected to said conversion means, said flip-flop and said combining means.

16. An apparatus as claimed in claim 13, wherein said combining means comprises:
   addition means, operatively connected to said conversion means, for adding and providing an output;
   storage means, operatively connected to said addition means, for storing the output of said addition means; and
   gate means, operatively connected to said detection means, said storage means and said addition means, for transferring the contents of said storage means to said addition means in dependence upon the detection of sequential data units of the same type, said addition means adding the runlength stored in said storage means to the runlength output by said conversion means when sequential data units of the same type are detected.

17. An apparatus as claimed in claim 8, wherein said multiplying means comprises:
   first storage means, operatively connected to the external character code generator, for storing the size change code; and
   second storage means, operatively connected to said first storage means and said code conversion means, for outputting the new image data unit in dependence upon the size change code and the image data unit.

18. An apparatus as claimed in claim 9, wherein said blank insertion means comprises:
    storage means, operatively connected to the external character code generator, for storing the blank interval code;
    multiplex means, operatively connected to said storage means, for passing the blank interval code therethrough; and
    addition means, operatively connected to said multiplex means and said multiplying means, for adding the blank image data unit between each group.

19. An apparatus as claimed in claim 11, wherein said combining means comprises:
    detection means, operatively connected to said multiplying means, for detecting changes in the type of image data unit between two sequentially related image data units;
    addition means, operatively connected to said multiplying means, for adding and providing an output;
    storage means, operatively connected to said addition means, for storing the output of said addition means; and
    gate means, operatively connected to said detection means, said storage means and said addition means, for transferring the contents of said storage means to said addition means in dependence upon the detection of sequential data units of the same type, said addition means adding the runlength stored in said storage means to the runlength output by said multiplying means when sequential data units of the same type are detected.

20. An image data conversion method, comprising the steps of:
    (a) converting, in parallel, each predetermined number of bits into a group of sequential fixed length image data codes including in each image data code an image color code and a runlength code;
    (b) detecting color changes in adjacent image color codes of the sequential image data codes; and
    (c) adding the values of runlengths of adjacent image data codes having the same color code.

21. A method as claimed in claim 20, further comprising the step of expanding the size of the image by changing the size of the runlength code of each image data code.

22. A method as claimed in claim 20, wherein each predetermined number of bits are converted into groups of fixed length image data codes and said method further comprises the step of inserting a blank image code between groups.

23. A method as claimed in claim 20, further comprising inserting a starting image data code in front of a first group.

* * * * *

UNITED STATES PATENT AND TRADEMARK OFFICE
CERTIFICATE OF CORRECTION

PATENT NO. : 4,516,173

DATED : May 7, 1985

INVENTOR(S) : SUSUMU ABE ET AL.

It is certified that error appears in the above-identified patent and that said Letters Patent is hereby corrected as shown below:

[57] IN THE ABSTRACT, line 5, "for" should be --of--.

Col. 2, line 25, "of" should be --for--;

lines 47 & 48, NO NEW PARAGRAPH.

Col. 5, line 53, after "1" insert --above--.

Signed and Sealed this

Eighth Day of October 1985

[SEAL]

Attest:

Attesting Officer

DONALD J. QUIGG

Commissioner of Patents and Trademarks—Designate